July 7, 1970 NORIO TSUBOUCHI ET AL 3,519,567

PIEZOELECTRIC CERAMICS

Filed Aug. 7, 1968 2 Sheets-Sheet 1

INVENTORS
NORIO TSUBOUCHI
MASAO TAKAHASHI
TOMEJI OHNO
TSUNEO AKASHI

Hopgood & Calimafde
ATTORNEYS

July 7, 1970 NORIO TSUBOUCHI ET AL 3,519,567

PIEZOELECTRIC CERAMICS

Filed Aug. 7, 1968 2 Sheets-Sheet 2

INVENTORS
NORIO TSUBOUCHI
MASAO TAKAHASHI
TOMEJI OHNO
TSUNEO AKASHI

Hopgood & Calimafde
ATTORNEYS 3,519,567
Patented July 7, 1970

3,519,567

PIEZOELECTRIC CERAMICS

Norio Tsubouchi, Masao Takahashi, Tomeji Ohno, and Tsuneo Akashi, Tokyo, Japan, assignors to Nippon Electric Company, Limited, Minato-ku, Tokyo-to, Japan Filed Aug. 7, 1968, Ser. No. 750,794
Claims priority, application Japan, Aug. 11, 1967, 42/51,505
Int. Cl. C04b *35/00*
U.S. Cl. 252—62.9 1 Claim

ABSTRACT OF THE DISCLOSURE

A piezoelectric ceramic is provided consisting essentially of a solid solution of the system $$Bi(Ni_{1/2}Ti_{1/2})O_3—Bi(Ni_{1/2}Zr_{1/2})O_3—PbTiO_3—PbZrO_3$$

Figure 1:
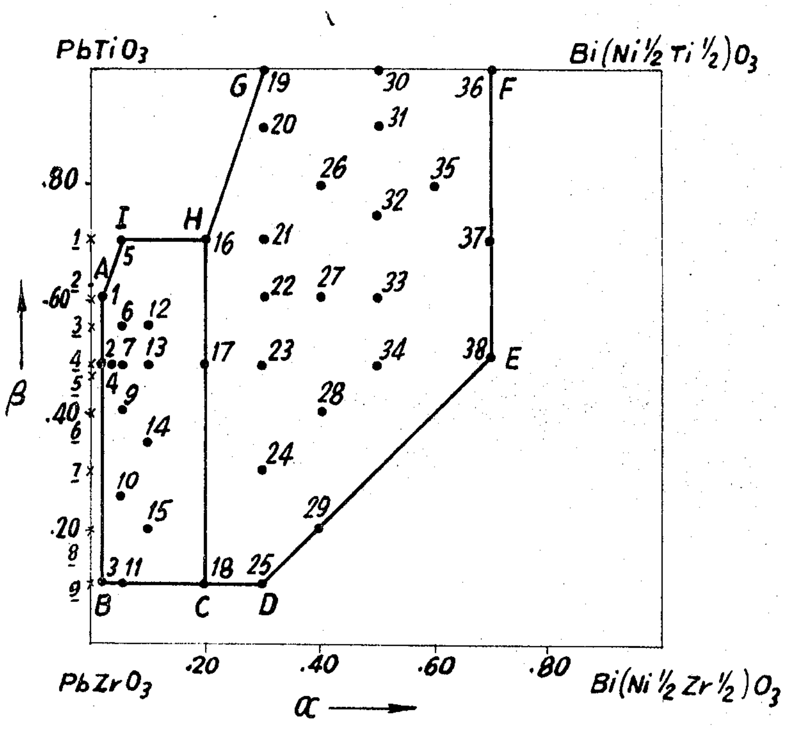

wherein up to 25 atom percent of lead may be replaced by at least one element selected from the group consisting of barium, strontium and calcium.

This invention relates to piezoelectric materials and more particularly to novel piezoelectric ceramics having excellent properties suitable for use in particular fields.

One of the typical fields of application of piezoelectric materials is in the manufacture of transducers for transmitting and receiving ultrasonic waves. In this case, the electromechanical coupling factor is the most essential measure for evaluating in practice the properties of piezoelectric materials to be used. The electromechanical coupling factor is representative of the efficiency of transforming electric oscillation into mechanical vibration and conversely of transforming mechanical vibration into electrical oscillation, the greater value thereof standing for better efficiency of interconversion and being desired for piezoelectric materials to be used in manufacture of transducers.

Piezoelectric materials have some other fundamental factors, such as dielectric loss, dielectric constant and mechanical quality factor, all serving for evaluation thereof. As for piezoelectric materials for transducers, the dielectric loss is desired to be small and the desirable value of the dielectric constant is large or small depending on electric loads. The mechanical quality factor which shows the reciprocal proportion of the energy consumed by the material during the energy conversion is not so much important, in this case.

The above matters are described in detail in, for example, D. Berlincourt et al., "Transducer Properties of Lead Titanate Zirconate Ceramics," IRE Transactions on Ultrasonic Engineering, February 1960, pp. 1–6 and R. C. V. Macario, "Design Data for Band-Pass Ladder Filters Employing Ceramic Resonators," Electronic Engineering, vol. 33, No. 3 (1961), pp. 171–177.

It is well known, however, that conventional piezoelectric ceramics, for example, barium titanate ($BaTiO_3$) and lead titanate-zirconate [$Pb(Ti{\cdot}Zr)O_3$] exhibit a small electromechanical coupling factor and are unfit for practical use. Improvement of this factor has been made only by way of incorporating various additional constituents into the ceramics.

The object of this invention is to provide novel piezoelectric ceramics which will exhibit a large electromechanical coupling factor.

Another object of this invention is to provide novel piezoelectric ceramics suited for use in particular fields, such as in the manufacture of transducers for transmitting and receiving ultrasonic waves.

The elements of ceramic filters and the transducer elements of mechanical filters provide other important fields of application of piezoelectric ceramics. In these fields, it is often required to broaden the pass band width of the filter. For this purpose, efforts have been heretofore directed only to development of piezoelectric ceramics having as high electromechanical coupling factor as possible. Higher electromechanical coupling factor accounts for smaller capacitance ratio of the ceramic material and hence for broader pass band of the filter which is determined approximately in inverse proportion to the capacitance ratio ($\gamma$). These efforts, however, obviously have a limit and are coming to a standstill. It has been found by the inventors that the pass band width of the filter can be broadened by employing piezoelectric materials having very small mechanical quality factor. This is because the mechanical quality factor ($Q_m$) of piezoelectric material has such a relation with the pass band width (B) of the filter using that material in accordance with the formula $$B \leq 1/\gamma + 1/Q_m$$

in which the term $1/Q_m$ was neglected before and because the recent progress of electronics enables compensation of the loss in energy consumed in the material by other active circuit components. Piezoelectric materials whose mechanical quality factor is made very small are therefore required to provide a mechanical or ceramic filter of the broad pass band.

In a resonator made from the piezoelectric material having a reduced mechanical quality factor, frequency response of output amplitude becomes less sensitive even in the vicinity of the resonant frequency. If the mechanical quality factor is reduced, the piezoelectric material could be thus applied to a field where less sensitive or less steep frequency response is needed. An example of the use of piezoelectric materials having a reduce $Q_m$ is described in K. W. Ragland et al., "Piezoelectric Pressure Transducer with Acoustic Absorbing Rod," The Review of Scientific Instruments, vol. 38, No. 6 (1967), pp. 740–742, wherein lead metaniobate ($PbNb_2O_6$) is used.

The well-known piezoelectric ceramic material having small $Q_m$ value of 5 to 10. However, its electromechanical coupling factor decreases at the same time to below 10%, so that the fields of application are restricted within very special uses. On the other hand, the compositions consisting of lead titanate zirconate [$Pb(Zr{\cdot}Ti)O_3$] and additives such as lanthanum oxide ($La_2O_3$), thorium oxide ($ThO_2$), niobium oxide ($Nb_2O_5$) or wolfram oxide ($WO_3$) have been known to have a reduced mechanical quality factor while maintaining the large electromechanical coupling factor, as disclosed in detail in, for example, Jour. Amer. Ceram. Soc. vol. 42, No. 7 (1959), p. 343 and Jour. Amer. Ceram. Soc., vol 48, No. 1 (1965), p. 54. However, the $Q_m$ value obtainable from these compositions is at the lowest about 80 to 100. If it is further reduced, the firing of the materials to form ceramics cannot be completely accomplished or there occurs large deviation in piezoelectric properties of the ceramics, and hence the produced ceramics become undesirable for practical use.

It is therefore another object of this invention to provide a piezoelectric ceramic material having the mechanical quality factor of a much reduced value while leaving the electromechanical coupling factor at a considerable value.

A still further object of the invention is to provide piezoelectric ceramics for use in ceramic or mechanical filter of a broad pass band.

The ceramic composition of this invention is featured by consisting essentially of a solid solution of $$Bi(Ni_{1/2}Ti_{1/2})O_3—Bi(Ni_{1/2}Zr_{1/2})O_3—PbTiO_3—PbZrO_3$$

quaternary system, which contains bismuth (Bi) as a trivalent metallic element, nickel (Ni) and lead (Pb) as divalent metallic elements and also titanium (Ti) and zirconium (Zr) as tetravalent metallic elements.

Where the ceramic compositions of the quaternary system $$Bi(Ni_{1/2}Ti_{1/2})O_3—Bi(Ni_{1/2}Zr_{1/2})O_3—PbTiO_3—PbZrO_3$$

are represented by the compositional formula $$[Bi(Ni_{1/2}Ti_{1/2})O_3]_t[Bi(Ni_{1/2}Zr_{1/2})O_3]_u[PbTiO_3]_v[PbZrO_3]_w$$

wherein $t$, $u$, $v$ and $w$ denote a set of molecular ratios and $$t+u+v+w=1.00$$

and where $\alpha$ and $\beta$ are respectively defined by $$\alpha=t/(t+v)=u/(u+w)$$

and $$\beta=t/(t+u)=v/(v+w)$$

it has been found that the compositions within the range determined by the following combinations of $\alpha$ and $\beta$ have practical utility:

| $\alpha$: | $\beta$ |
|---|---|
| 0.01 | 0.60 |
| 0.01 | 0.10 |
| 0.20 | 0.10 |
| 0.30 | 0.10 |
| 0.70 | 0.50 |
| 0.70 | 1.00 |
| 0.30 | 1.00 |
| 0.20 | 0.70 |
| 0.05 | 0.70 |

It will be seen that $\alpha$ also represents (number of Bi atom)/(sum of Bi and Pb atoms)

while $\beta$=(number of Ti atom)/(sum of Ti and Zr atoms). In the above compositions, at least one of barium, strontium, and calcium may be substituted for up to 25 atom percent of lead contained in the original compositions.

The ceramic compositions of this invention show an excellent piezoelectric activity and hence have a high electromechanical coupling factor, when within the range defined by the following combinations of $\alpha$ and $\beta$:

| $\alpha$: | $\beta$ |
|---|---|
| 0.01 | 0.60 |
| 0.01 | 0.10 |
| 0.20 | 0.10 |
| 0.20 | 0.70 |
| 0.05 | 0.70 |

On the other hand, it is possible to reduce the mechanical quality factor remarkably with the electromechanical coupling factor being left at a considerable value, if the ceramic compositions are restricted within the range determined by the following six sets of $\alpha$ and $\beta$:

| $\alpha$: | $\beta$ |
|---|---|
| 0.20 | 0.70 |
| 0.20 | 0.10 |
| 0.30 | 0.10 |
| 0.70 | 0.50 |
| 0.70 | 1.00 |
| 0.30 | 1.00 |

Excellent piezoelectric properties of the ceramic compositions of this invention will be apparent from the following more particular description of preferred examples of this invention, as illustrated in the accompanying drawings.

Figure 2:
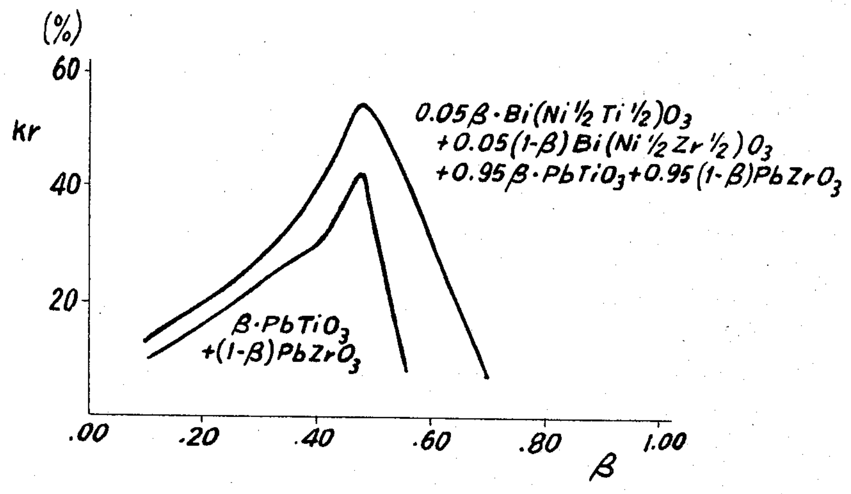
Figure 3:
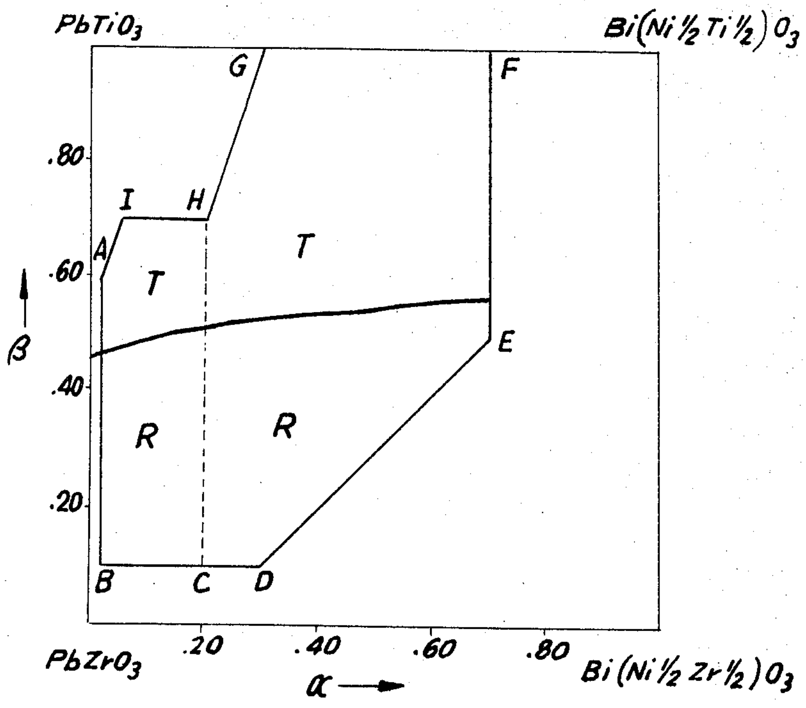

In the drawings:

FIG. 1 is a diagram of the quaternary system $$Bi(Ni_{1/2}Ti_{1/2})O_3—Bi(Ni_{1/2}Zr_{1/2})O_3—PbTiO_3—PbZrO_3$$

showing both the effective range of the compositions of this invention and the specific compositions as exemplified in the examples;

FIG. 2 is a graph showing the electromechanical coupling factors of both the conventional lead titanate-zirconate ceramics and the ceramics of this invention, as a function of the change in $\beta$ as defined above in both the ceramics; and FIG. 3 is the phase diagram of the quaternary system of this invention.

EXAMPLES

Powdered materials of bismuth sesquioxide ($Bi_2O_3$), nickel monoxide (NiO), lead monoxide (PbO), titanium dioxide ($TiO_2$) and zirconium dioxide ($ZrO_2$) were used as starting materials to obtain the ceramics of this invention, unless otherwise stated. These powdered materials were weighed to provide final specimens having the compositional proportions shown in Table 1. In addition, the powder of lead monoxide, titanium dioxide and zirconium dioxide were weighed to obtain the conventional lead titanate zirconate ceramics having the compositional proportions shown in Table 2.

The respective powders were mixed in a ball mill with distilled water. The mixed powders were subjected to filtration, dried, crushed, and then pre-sintered for one hour at a temperature of 750 to 900° C. The sintered materials were again crushed, and after mixing with a small amount of distilled water, were press-molded into discs of 20 mm. in diameter at a pressure of 700 kg./cm.$^2$ and sintered in an atmosphere of lead oxide and bismuth oxide for one hour. The sintering was carried out at a temperature of 1250° C. to 1300° C. for the specimens in which $\alpha$ ranged up to 0.20, at 1220° C. for those wherein $\alpha$ ranged up to 0.30, at 1100° C. for those wherein the same ranged up to 0.50, and at 950° C. for specimens of $\alpha$ exceeding 0.50. The resulting ceramic discs were polished on both surfaces to the thickness of one millimeter, provided with silver electrodes on both surfaces, and thereafter piezoelectrically activated through the polarization treatment for one hour at 100° C. under an applied D.C. electric field of 50 kv./cm. for those specimens in which $\alpha$ ranged up to 0.10, while a D.C. electric field of 30 kv./cm. at 100° C., 40 kv./cm. at room temperature, and 30 kv./cm. at room temperature were respectively used in the polarization treatment for the specimens in which $\alpha$ ranged up to 0.20, up to 0.30, and over 0.30.

After the ceramic discs had been allowed to stand for 24 hours, the electromechanical coupling factor for the radial mode vibration ($k_r$) and the mechanical quality factor ($Q_m$) were measured to evaluate the piezoelectric activities. The measurement of these piezeoelectric properties was made according to the IRE standard circuit. The value of $k_r$ was calculated by the resonant to antiresonant frequency method. The dielectric constant ($\epsilon$) and the dielectric loss (tan $\delta$) were also measured at a frequency of 1 kHz.

Tables 1 and 2 show typical results obtained. In the tables, specimens are arranged according to the increase in the value of α and there are also listed several values of Curie temperature which was determined through measurement of temperature variation in the dielectric constant (ε). The novel compositions of the specimens of Table 1 are shown with black points, while the conventional compositions of the specimens of Table 2 are indicated by crosses in the same figure.

Comparison of the results for the specimens Nos. 2 and 4 of Table 1 with those for the specimen No. 4 of Table 2 will reveal that the greatest $k_r$ values of the novel ceramics of this invention are far superior to the maximum $k_r$ value of the conventional lead titanate-zirconate ceramics which has been known as the most excellent piezoelectric ceramic material. Moreover, comparison of the results for the specimens Nos. 1 to 18 in which α is 0.01 to 0.20 of Table 1 with those for the specimens of Table 2, particularly between the novel and conventional ceramics where the β values are same or similar to each other, indicates that the ceramics of this invention have a remarkably improved $k_r$ value. This latter fact will be more clearly understood from FIG. 2, wherein the curve of a thick line represents the $k_r$ values of the novel ceramics with the α value being fixed at 0.05 and the β value being varied, while the curve of a fine line shows the $k_r$ values of conventional lead titanate zirconate ceramics with the varying β value.

As is seen from the above, this invention provides excellent, useful piezoelectric ceramics having superior piezoelectric activity. In the novel ceramics of this invention, the superior piezoelectric activity as mentioned above are available when the compositions fall within the polygonal area A–B–C–H–I of FIG. 1. The sets of the α and β values of the vertices of this polygon A–B–C–H–I are as follows:

| | α | β |
|---|---|---|
| A | 0.01 | 0.60 |
| B | 0.01 | 0.10 |
| C | 0.20 | 0.10 |
| H | 0.20 | 0.70 |
| I | 0.05 | 0.70 |

Where the α value is less than or more than that falling within the above-mentioned area, the value of $k_r$ becomes fairly or very small. In case the β value does not fall within said area, there results unuseful piezoelectric ceramics having markedly inferior piezoelectric activity.

Table 1, particularly Nos. 16 to 38, show that the $Q_m$ value is remarkably reduced in the ceramics of this invention, while the $k_r$ value is maintained at a fairly high value or in some cases increased as will be seen from the comparison with Table 2. Thus, this invention provides the useful piezoelectric ceramics having peculiar properties favorable for use in particular fields such as the element of broad band width filters. These peculiar properties, namely very small $Q_m$ values with $k_r$ left at considerable values, are obtainable where the ceramic compositions fall within the range as defined by the polygon C–D–E–F–G–H of FIG. 1. The combinations of the α and β values at the vertices of the polygon are as follows:

| | α | β |
|---|---|---|
| C | 0.20 | 0.10 |
| D | 0.30 | 0.10 |
| E | 0.70 | 0.50 |
| F | 0.70 | 1.00 |
| G | 0.30 | 1.00 |
| H | 0.20 | 0.70 |

If α is smaller than that falling within this range, $Q_m$ increases. Where α exceeds this range, accomplishment of the sintering in manufacture of ceramics becomes difficult and besides $k_r$ so decreases as to make the practical use impossible. In case β is smaller than the said range, $k_r$ extremely decreases as well.

In view of the above, it is determined that the ceramics of this invention, if required to apply to a practical use, should have the compositions falling within the area A–B–D–E–F–G–H–I of FIG. 1. The ceramics of this effective compositions show excellent piezoelectric properties and have a high Curie temperature, as shown in Table 1, so that the piezoelectric activity may not be lost up to elevated temperature.

The quaternary system of $$Bi(Ni_{1/2}Ti_{1/2})O_3—Bi(Ni_{1/2}Zr_{1/2})O_3—PbTiO_3—PbZrO_3$$

of this invention exists in a solid solution in greater parts of compositions and such a solid solution has a perovskite-type crystalline structure. FIG. 3 shows the crystalline phases of the ceramic compositions falling within the area A–B–C–D–E–F–G–H–I of FIG. 1 as determined at room temperature by the powder method of X-ray analysis. These compositions have a perovskite-type crystalline structure and belong to either the tetragonal phase (indicated by T in the figure) or the rhombohedral phase (indicated by R). The morphotropic phase boundary is shown with a thick line in the figure. In general, the value of $k_r$ is remarkably great in the vicinity of this phase boundary.

It will be apparent that the starting materials to be used in manufacture of the ceramics of this invention are not limited to those used in the above examples. In detail those oxides may be used instead of any starting material of the above examples, which are easily decomposed at elevated temperature to form required compositions, as exemplified by $Pb_3O_4$ for PbO in the examples Nos. 6, 14, 23, 27 and 31. Also, those salts such as oxalates or carbonates may be used instead of the oxides used in the examples, which are easily decomposed into the respective oxides at elevated temperature. Otherwise, hydroxides of the same character as above may be used instead of the oxides. Moreover, excellent piezoelectric ceramics having similar properties to the above examples are still also obtainable by preparing separately powdered material of each of $Bi(Ni_{1/2}Ti_{1/2})O_3$, $Bi(Ni_{1/2}Zr_{1/2})O_3$, $PbTiO_3$ and $PbZrO_3$ in advance and by using them as starting materials to be mixed subsequently.

The example No. 8 of Table I reveals that the excellent piezoelectric activity is obtained by replacing a part of lead by strontium. In general, the piezoelectric activity of the compositions of the type where lead titanate or zirconate is contained is not lost even when up to 25 atom percent of lead contained in the composition are replaced by at least one of barium, strontium and calcium. This fact can be presumed from a number of researches, for example, the U.S. Pat. 2,906,710. Thus, the substitution as mentioned is permissible in the ceramic compositions of this invention.

It is usual that zirconium dioxide ($ZrO_2$) available in the market contains several percent of hafnium dioxide ($HfO_2$). Accordingly, the ceramic compositions of this invention are allowed to contain small amounts of such oxides or elements as existing in the materials available in the market. Moreover, it is presumable that addition of a small amount of some additional agent to the ceramic compositions of this invention may further improve the piezoelectric properties, from the similar fact recognized in the conventional lead titanate zirconate ceramics. It will be understood from the foregoing that the ceramic compositions of this invention may include appropriate additives.

While there have been described what at present are believed to be the preferred examples of this invention, it will be obvious that various modifications can be made therein without departing from the scope of this invention and that this invention covers all the ceramic compositions as specified in the appended claims.

TABLE 1

| No. | Composition α | Composition β | $k_r$, percent | $Q_m$ | ε | Tan δ, percent | Curie temp. (° C.) |
|---|---|---|---|---|---|---|---|
| 1 | 0.01 | 0.60 | 15 | 300 | 410 | 1.3 | ---------- |
| 2 | 0.01 | 0.48 | 61 | 280 | 950 | 1.5 | ---------- |
| 3 | 0.01 | 0.10 | 12 | 910 | 180 | 2.0 | ---------- |
| 4 | 0.02 | 0.48 | 65 | 300 | 880 | 1.6 | 375 |
| 5 | 0.05 | 0.70 | 7 | 70 | 300 | 1.4 | ---------- |
| 6* | 0.05 | 0.55 | 43 | 180 | 780 | 1.7 | ---------- |
| 7 | 0.05 | 0.48 | 55 | 270 | 540 | 1.6 | ---------- |
| 8** | 0.05 | 0.48 | 64 | 320 | 920 | 1.6 | ---------- |
| 9 | 0.05 | 0.40 | 40 | 330 | 560 | 3.2 | ---------- |
| 10 | 0.05 | 0.25 | 24 | 490 | 320 | 3.2 | ---------- |
| 11 | 0.05 | 0.10 | 13 | 470 | 290 | 3.3 | ---------- |
| 12 | 0.10 | 0.55 | 34 | 250 | 1,070 | 1.6 | ---------- |
| 13 | 0.10 | 0.48 | 48 | 350 | 500 | 1.6 | 345 |
| 14* | 0.10 | 0.35 | 31 | 380 | 370 | 2.5 | ---------- |
| 15 | 0.10 | 0.20 | 18 | 330 | 290 | 2.6 | ---------- |
| 16 | 0.20 | 0.70 | 27 | 160 | 220 | 2.1 | ---------- |
| 17 | 0.20 | 0.48 | 37 | 120 | 470 | 1.7 | 310 |
| 18 | 0.20 | 0.10 | 8 | 180 | 210 | 4.1 | ---------- |
| 19 | 0.30 | 1.00 | 9 | 42 | 270 | 4.3 | ---------- |
| 20 | 0.30 | 0.90 | 9 | 23 | 330 | 3.3 | ---------- |
| 21 | 0.30 | 0.70 | 29 | 29 | 870 | 3.4 | ---------- |
| 22 | 0.30 | 0.60 | 32 | 25 | 1,450 | 5.0 | 270 |
| 23* | 0.30 | 0.48 | 28 | 28 | 1,000 | 3.9 | 260 |
| 24 | 0.30 | 0.30 | 16 | 45 | 710 | 5.9 | ---------- |
| 25 | 0.30 | 0.10 | 6 | 70 | 265 | 3.8 | ---------- |
| 26 | 0.40 | 0.80 | 37 | 38 | 1,310 | 3.8 | ---------- |
| 27* | 0.40 | 0.60 | 24 | 24 | 1,290 | 8.9 | ---------- |
| 28 | 0.40 | 0.40 | 11 | 40 | 630 | 5.3 | ---------- |
| 29 | 0.40 | 0.20 | 9 | 56 | 410 | 5.7 | ---------- |
| 30 | 0.50 | 1.00 | 18 | 39 | 820 | 4.6 | ---------- |
| 31* | 0.50 | 0.90 | 15 | 10 | 295 | 4.4 | ---------- |
| 32 | 0.50 | 0.75 | 17 | 24 | 500 | 5.9 | ---------- |
| 33 | 0.50 | 0.60 | 13 | 30 | 1,050 | 9.2 | 210 |
| 34 | 0.50 | 0.48 | 9 | 40 | 940 | 4.6 | ---------- |
| 35 | 0.60 | 0.80 | 17 | 7 | 305 | 9.2 | ---------- |
| 36 | 0.70 | 1.00 | 8 | 27 | 550 | 5.9 | ---------- |
| 37 | 0.70 | 0.70 | 11 | 22 | 480 | 6.8 | ---------- |
| 38 | 0.70 | 0.50 | 7 | 40 | 620 | 9.2 | ---------- |

NOTE.—In manufacture of the specimens whose Nos. have a single asterisk (*), triplumbic tetroxide ($Pb_3O_4$) was used instead of lead monoxide (PbO) as one of the starting materials. In manufacture of the specimen with double asterisk (**), strontium carbonate ($SrCO_3$) calculated on the basis of strontium monoxide (SrO) was used to replace 5 atom percent of lead (Pb) by strontium (Sr).

TABLE 2

| No. | Composition α | Composition β | $k_r$, percent | $Q_m$ | ε | Tan δ, percent |
|---|---|---|---|---|---|---|
| 1 | 0.00 | 0.70 | ---------- | ---------- | 340 | 5.7 |
| 2 | 0.00 | 0.60 | ---------- | ---------- | 300 | 2.4 |
| 3 | 0.00 | 0.55 | 8 | 30 | 350 | 1.3 |
| 4 | 0.00 | 0.48 | 42 | 250 | 1,060 | 1.6 |
| 5 | 0.00 | 0.45 | 38 | 290 | 640 | 3.0 |
| 6 | 0.00 | 0.40 | 30 | 320 | 460 | 3.1 |
| 7 | 0.00 | 0.30 | 24 | 380 | 380 | 3.3 |
| 8 | 0.00 | 0.20 | 15 | 470 | 350 | 3.3 |
| 9 | 0.00 | 0.10 | 10 | 580 | 280 | 3.4 |

NOTE.—For the specimens Nos. 1 and 2, evaluation of piezoelectric activity was impossible.

What is claimed is:

1. Piezoelectric ceramics consisting essentially of the composition which is represented by the formula $$[Bi(Ni_{1/2}Ti_{1/2})O_3]_t[Bi(Ni_{1/2}Zr_{1/2})O_3]_u[PbTiO_3]_v[PbZrO_3]_w$$

where $t$, $u$, $v$ and $w$ denote a set of molecular ratios and $t+u+v+w=1.00$, and where up to 25 atom percent of lead may be replaced by at least one element selected from the group consisting of barium, strontium and calcium, and which falls within the polygonal area A–B–D–E–F–G–H–I of FIG. 1 of the drawings, the vertices of said polygonal area being determined by the following combinations of α and β, where said α and β are respectively given by $\alpha=t/(t+v)=u/(u+w)$ and $$\beta=t/(t+u)=v/(v+w):$$

| | α | β |
|---|---|---|
| A | 0.01 | 0.60 |
| B | 0.01 | 0.10 |
| D | 0.30 | 0.10 |
| E | 0.70 | 0.50 |
| F | 0.70 | 1.00 |
| G | 0.30 | 1.00 |
| H | 0.20 | 0.70 |
| I | 0.05 | 0.70 |

References Cited

UNITED STATES PATENTS 3,068,177 12/1962 Sugden ------------ 252—62.9

3,268,783 8/1966 Saburi.

FOREIGN PATENTS 888,740 2/1962 Great Britain.

TOBIAS E. LEVOW, Primary Examiner

J. COOPER, Assistant Examiner

U.S. Cl. X.R.

106—39